(12) United States Patent
Robert

(10) Patent No.: US 7,981,715 B2
(45) Date of Patent: Jul. 19, 2011

(54) MEMS/NEMS STRUCTURE COMPRISING A PARTIALLY MONOCRYSTALLINE ANCHOR AND METHOD FOR MANUFACTURING SAME

(75) Inventor: Philippe Robert, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 72 days.

(21) Appl. No.: 12/498,598

(22) Filed: Jul. 7, 2009

(65) Prior Publication Data
US 2010/0006840 A1 Jan. 14, 2010

(30) Foreign Application Priority Data

Jul. 9, 2008 (FR) ...................................... 08 54670

(51) Int. Cl.
*H01L 21/00* (2006.01)
(52) U.S. Cl. ................ 438/52; 438/48; 438/50; 438/51; 257/49; 257/E21.001
(58) Field of Classification Search .................... 438/48, 438/50, 51, 52; 257/49, E21.001
See application file for complete search history.

(56) References Cited

U.S. PATENT DOCUMENTS

| 4,948,757 A * | 8/1990 | Jain et al. .......................... 438/52 |
| 7,057,251 B2 * | 6/2006 | Reid .............................. 257/432 |
| 2005/0032266 A1 | 2/2005 | Suzuki |
| 2005/0231794 A1 * | 10/2005 | Funaki ........................... 359/291 |
| 2008/0108165 A1 | 5/2008 | Lutz et al. |
| 2009/0002804 A1 * | 1/2009 | Natarajan et al. ............. 359/291 |

* cited by examiner

*Primary Examiner* — Fernando L Toledo
(74) *Attorney, Agent, or Firm* — Oblon, Spivak, McClelland, Maier & Neustadt, L.L.P.

(57) ABSTRACT

The invention relates to a method for producing a MEMS/NEMS structure from a substrate made in a monocrystalline semiconductor material, the structure comprising a flexible mechanical element connected to the substrate by at least one anchoring zone, the method comprising the following steps:

the formation of a protection layer on one face of the substrate, the protection layer being made in a monocrystalline material different from the material of the substrate, etching of the protection layer and the substrate in order to produce at least one cavity, the etching being done so as to leave an overhang made in the material of the protection layer on the edges of the cavity, filling in of the cavity with an electrically insulating material in order to obtain an insulating anchoring portion, epitaxy of a semiconductor material from the protection layer and the electrically insulating material in order to obtain a layer designed to produce the flexible mechanical element, liberation of the flexible mechanical element while allowing at least a portion of said overhang to remain.

12 Claims, 7 Drawing Sheets

MEMS/NEMS STRUCTURE COMPRISING A PARTIALLY MONOCRYSTALLINE ANCHOR AND METHOD FOR MANUFACTURING SAME

TECHNICAL FIELD

The invention relates to a MEMS (Micro-Electro-Mechanical-System) or NEMS (Nano-Electro-Mechanical-System) structure comprising at least one anchor serving to secure a flexible member (beam or membrane). It also relates to a method for producing such a structure.

PRIOR ART

The use of monocrystalline silicon to produce MEMS or NEMS components is interesting for several reasons. Its mechanical properties are excellent, in particular in relation to polycrystalline silicon. Large thicknesses can be used (in the case of polycrystalline silicon, the thickness is generally limited to 20 µm). It has very good piezoelectric properties. Its semiconductor properties, well known and well mastered, allow co-integration of these mechanical components with the associated electronics.

In the prior art, we find several embodiments of MEMS/NEMS structures in monocrystalline silicon, i.e. freed mechanical components, able to move under the action of an external force, in surface technology.

The SOI technology is the most used. In this case, the component is made on the active layer of the SOI substrate and the buried oxide serves both as etching boundary layer for the silicon and as sacrificial layer. The mechanical structure is freed via the front face of the substrate. A first variation consists of etching the entire rear face in order to free the mechanical component, stopping on the buried oxide. The liberation is then done via the rear surface of the substrate. A second variation consists of transferring the SOI substrate onto a cavity in order to free it by simple etching of the silicon.

The interest of the SOI technology for MEMS rests on the buried oxide, which makes it possible to:
- serve as boundary layer for etching of the silicon, and therefore precisely define the thickness of the silicon layer on which the component will be made (regardless of the variation),
- serve as sacrificial layer (in the case of a primarily front surface method),
- have an electric insulating layer supporting the MEMS/NEMS component (to avoid short circuiting all of the elements of the MEMS/NEMS).

However, the major drawback of SOI technology is its high price. We have also recently observed problems with poorly controlled stresses in the SOI which, in some configurations, are very damaging for the MEMS/NEMS.

In the SON (Silicon-on-Nothing) technology, a layer of SiGe is grown on a standard silicon substrate, and on this layer of SiGe, one grows a layer of monocrystalline silicon. The MEMS/NEMS component is made on this last layer of silicon and the SiGe serves as sacrificial layer. For liberation, one uses dry etching of the SiGe with a $CF_4$ base, selective in relation to the monocrystalline silicon.

The main interest of the SON technology is that it involves a low-cost method. This also allows access to very small thickness of silicon (typically several 100 nm), for example for NEMS. Its drawbacks, however, are manifold.

Isotope etching of the SiGe is not very selective in relation to the silicon. One is therefore limited to freeing narrow patterns (typically smaller than one µm). The thickness of silicon epitaxied on the SiGe is generally limited to several hundreds of nanometers (a risk of dislocations existing if one wishes to obtain large silicon thicknesses). The SiGe is semi-conductive. In order to have electrically insulated zones on the MEMS/NEMS, placement of an insulating layer in the zones needing to be electrically insulated is assumed (depositing $SiO_2$ or SiN, for example). The layer of epitaxied silicon above this insulating layer will be polycrystalline (and not monocrystalline). This point can be fairly crucial, since these zones correspond to anchoring zones where the material is particularly stressed. Having a polycrystalline material in these anchoring zones (rather than a monocrystalline one) leads either to a lower quality factor, in the case of resonant structures, or to being more sensitive to mechanical stresses (for example, shock resistance).

In SCREAM technology, one starts with a standard substrate to produce a MEMS component and one uses a "buried" portion of the source silicon as sacrificial layer. The method is broken down as follows: DRIE (Deep Reactive Ion Etching) etching of the MEMS structure, oxidation, anisotropic etching of the oxide, isotropic etching of the silicon to free the MEMS, metallization of the structure (on the sides and top).

The main interest of the SCREAM technology is its simplicity and low cost.

It does, however, have a number of drawbacks. There is no insulating anchoring. This results in the creation of significant mechanical stresses on the MEMS (due to the presence of thermal oxide and metal on the freed structures). This addition of oxide and metal on the monocrystalline silicon makes the mechanical component not as good (lower quality factor in the case of a resonator, for example). Metallization, which is done after freeing of the structure, requires the use of mechanical masking during the depositing. This method is not very industrial and provides a very mediocre pattern resolution.

The SCREAM technology produces poorly defined structures which are etched under the oxide mask during isotropic etching of the silicon (absence of oxide under the structure to be freed).

Another technology is called APSM (Advanced Porous Silicon Membrane). It is used by the company BOSCH in order to produce pressure sensors. In this case, a source silicon substrate is made porous in the zones dedicated to the localization of the cavities. The membrane is produced by silicon epitaxy on the porous surface produced.

The manufacturing method is conducted as follows. The surface of a source silicon substrate is treated with hydrofluoric acid and subjected to a voltage in order to obtain a very porous layer of silicon (nanoporous). Then, a layer of monocrystalline silicon, intended to form a membrane, for example, is formed on the porous layer. The nanoporous silicon layer is then subjected to thermal treatment at a temperature of 1000° C. The nanoporous layer disintegrates. What remains is a continuous cavity with a reference pressure of less than 1 millibar. On this subject, one may refer to the article "A novel micromachining process for the fabrication of monocrystalline Si-membranes using porous silicon" by S. ARMBRUSTER et al., Digest of Technical Papers Transducers'03, 2003, page 246.

As with the SCREAM technology, the major drawback of this technology lies in the absence of an insulating anchoring.

BRIEF DESCRIPTION OF THE INVENTION

Through the prior art described above on the MEMS/NEMS technology in monocrystalline silicon produced in surface technology and not using an SO1 substrate, one sees that when one wishes to arrange electrically insulated embedding zones, one loses the monocrystalline structure at these anchors (see the SON technology and the SCREAM and APSM technologies which, in their current versions, do not include insulating anchors).

In order to obtain monocrystalline anchors, the primary idea of the invention consists of:
- producing the embedding cavities by etching, leaving an "outcropping", i.e. an extension (an overhang) on the edges of the cavities, in a monocrystalline protective material,
- filling the cavities with a suitable material (for example $SiO_2$, $Si_3N_4$ or other insulating materials), the nature of the filling material being chosen depending on the expected role of these anchors and its compatibility with the continuation of the method,
- forming a layer of monocrystalline semi-conductive material (for example, silicon) from the monocrystalline protective material, this layer being designed in order to subsequently serve to produce the MEMS or NEMS component.

For this, during the etching of the embedments, the overhanging profile is obtained for instance by isotropic etching of the monocrystalline semiconductor material, selective in relation to the monocrystalline protection layer.

The protection layer is in a monocrystalline material different from the layer of monocrystalline semiconductor material designed to form the MEMS or NEMS component. It allows a regrowth of the monocrystalline semiconductor material by epitaxy with a possibility of in situ doping of the material thus epitaxied. It resists dry or wet etching of the substrate material or of the epitaxied material (selective etching). It may potentially be etched selectively in relation to the surrounding materials by a dry or wet etching method.

A first object of the invention consists of a method for producing a MEMS/NEMS structure from a substrate comprising at least one portion in a monocrystalline semiconductor material, the structure comprising a flexible mechanical element attached to said portion of the substrate by at least one anchoring zone, the method comprising the following steps:
- a step for forming a first protection layer in a monocrystalline material on a free face of said portion of the substrate, the first protection layer being in a different material from the material of said substrate portion in monocrystalline semiconductor material,
- a step for etching the first protection layer and the substrate in order to produce at least one cavity, the etching being conducted to leave an overhang in the material of the protection layer over the edges of the cavity,
- a step for filling of the cavity with an electrically insulating material up to the free face of the first protection layer in order to obtain an insulating anchoring portion,
- an epitaxy step including the epitaxy of a semiconductor material from the first protection layer and of the electrically insulating material in order to obtain a layer designed for the production of the flexible mechanical element, the epitaxied layer being monocrystalline on the first protection layer and polycrystalline on the electrically insulating material,
- a step for releasing the flexible mechanical element by etching, through a mask, from at least the first protection layer, the etching allowing at least one portion of said overhang to remain.

"Flexible mechanical element" refers to any suspended element capable of deforming. This deformation can be caused, for example, by external excitation.

According to one embodiment, the method also comprises the following steps:
- formation of a stopping layer for a planarization operation, on the first protection layer, before the step for etching of the first protection layer,
- etching of the stopping layer in order to produce the cavity,
- filling in the cavity, making the electrically insulating material overhang the free face of the first protection layer,
- planarization operation is done until the free face of the first protection layer is exposed.

The planarization operation can comprise chemical-mechanical polishing with stopping on the stopping layer followed by etching of the stopping layer and of the material filling in the cavity until the free face of the first protection layer is exposed.

The liberation (or releasing) step can include, on the epitaxied semiconductor material from the first protection layer and the electrically insulating layer:
- the formation of a second protection layer,
- the etching, successively, of the second protection layer, the epitaxied semiconductor layer and, eventually, the first protection layer in order to define the flexible mechanical element, and
- the formation of a third protection layer on the assembly obtained in the preceding step.

The second protection layer and the third protection layer can be formed by deposition or epitaxy. These second and third protection layers are chosen so as not to be etched during the releasing of the mechanical element.

The step for releasing the mechanical element can also include the formation of a cavity in the substrate. It can also include etching of a portion of the third protection layer formed on the face of the substrate.

Said portion of the substrate can be made in silicon. The first protection layer can be made in SiGe. The electrically insulating material can be chosen from $SiO_2$ and $Si_3N_4$. The epitaxied semiconductor material from the first protection layer can be silicon.

A second object of the invention consists of a MEMS/NEMS structure comprising a substrate comprising at least one portion in monocrystalline semiconductor material and a flexible mechanical element located above one face of said portion of the substrate, defined in at least one epitaxied layer and attached to the substrate by at least one anchoring zone, the anchoring zone comprising:
- a portion made in an electrically insulating material housed in a cavity of the substrate formed from the face of the substrate, the portion made in electrically insulating material protruding beyond the face of the substrate and forming a recess in relation to the edges of the cavity,
- a portion made in monocrystalline semiconductor material at least partially filling in said recess while forming an overhang,
- a portion belonging to the epitaxied layer made up of polycrystalline material above the projection and monocrystalline material above the overhang.

BRIEF DESCRIPTION OF THE DRAWINGS

The invention will be better understood and other advantages and particularities will appear upon reading the description which follows, provided as a non-limiting example, accompanied by the appended drawings in which.

DETAILED DESCRIPTION OF THE INVENTION

The continuation of the description will pertain, as a non-limiting example, to the production of a MEMS structure from a source substrate in monocrystalline silicon, with a protection layer made in monocrystalline SiGe and an epitaxied layer of monocrystalline silicon.

FIGS. 1A to 1F are transverse cross-sectional views illustrating the first steps of an implementation of the manufacturing method according to the present invention.

Figure 1A:
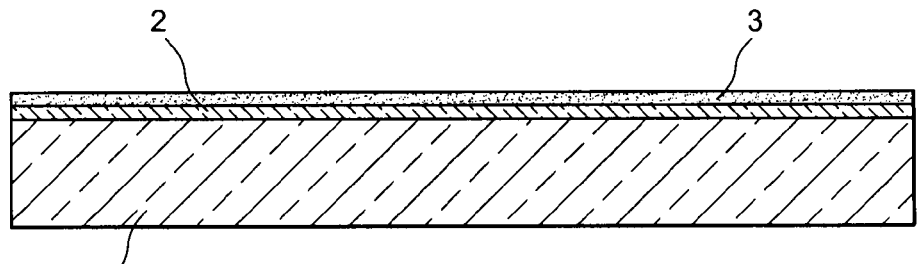
FIGS. 1A and 1F illustrate the first steps of an implementation of the manufacturing method according to the present invention.
Figure 1B:
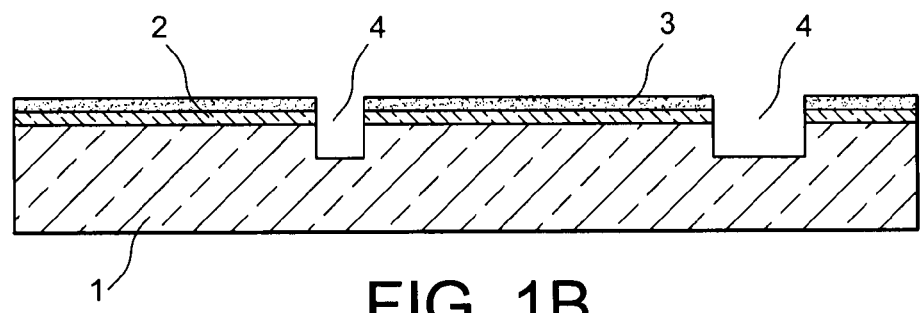
Figure 1C:
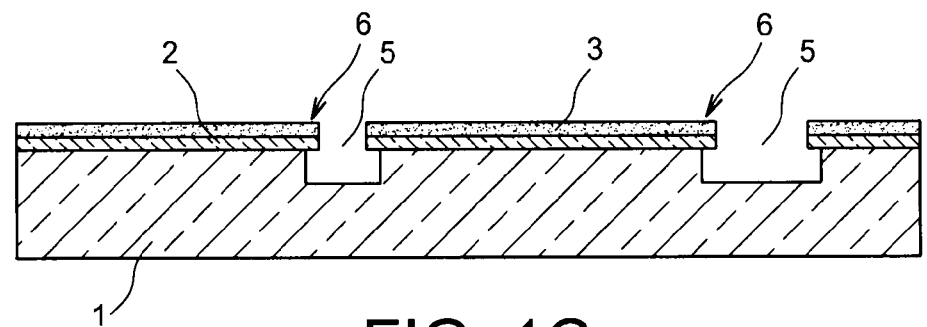
Figure 1D:
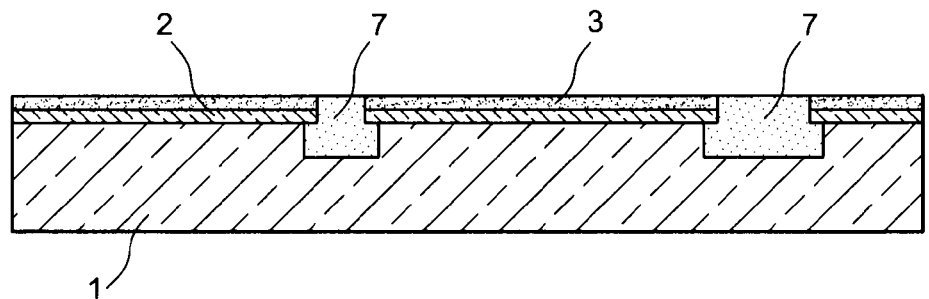

FIG. 1A shows a source substrate made in monocrystalline silicon 1 on a face from which we have formed, for example by epitaxy, a monocrystalline protection layer made in SiGe 2, for example with a thickness of 70 nm and comprising between 20 and 30% of germanium. On the SiGe layer 2, a stopping layer 3 for a later planarization is formed. This stopping layer 3 is for example in silicon nitride and can have a thickness of 0.2 µm.

One then proceeds to form cavities. To do this, one performs lithography and etching of the layers 3 and 2 and DRIE etching of the silicon substrate 1 in order to obtain cavities 4 having a depth of 0.3 µm, for example, in the substrate 1 (see FIG. 1B). The etching of the substrate 1 (dry etching or wet etching) is isotropic and selective in relation to the monocrystalline protection layer 2. One can also alternate between anisotropic etching and isotropic etching. For this selective etching, one can refer to the article "Characterization of a SiGe layer after isotropic etching of surrounding Si" by S. BOREL et al., SiGe Technology and Device Meeting 2006, ISTDM 2006, Third International, May 15-17, 2006.

One then proceeds with isotropic etching of the substrate 1, selective in relation to the protection layer 2 and the stopping layer 3. One then obtains (see FIG. 1C) cavities 5 of increased size and presenting an overhang 6 on the edges of the cavities 5. The extension of the overhang 6 above the cavity 5 can be 1 µm.

The cavities 5 are then filled in by deposition of an insulating material, for example silicon oxide or silicon nitride. The cavities are then filled with an electrically insulating material 7. One then performs chemical-mechanical polishing (CMP), stopping on the stopping layer 3, (see FIG. 1D).

The stopping layer 3 is then etched at the same time as the material filling in the cavities and located on the same level as the stopping layer 3. One obtains the structure illustrated in FIG. 1E which shows the electrically insulating material 7 projecting outside the cavities and the protection layer 2 forming an overhang in the recessed portions of the electrically insulating material 7.

On the obtained structure, one forms a silicon layer by epitaxy. This epitaxied layer comprises (see FIG. 1F) monocrystalline portions 9 at the locations where its growth has taken place above the protection layer 2 and polycrystalline portions 10 at the locations where its growth took place above the electrically insulating material 7. The thickness of the epitaxied layer can be between 1 and 5 µm.

Figure 1E:
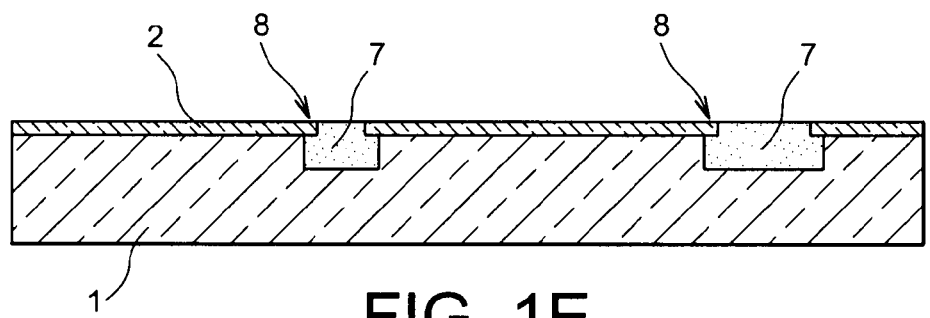
Figure 1F:
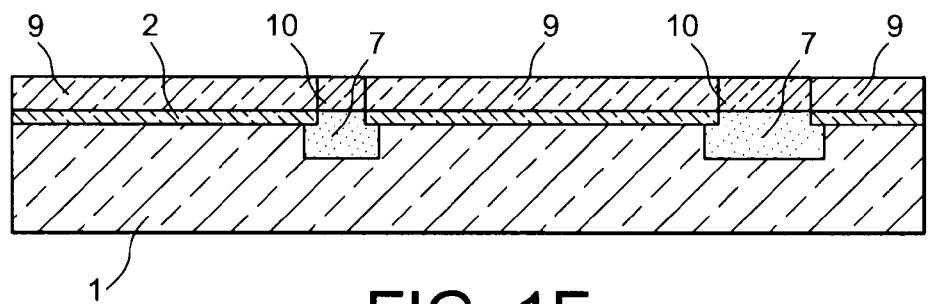
Figure 2:
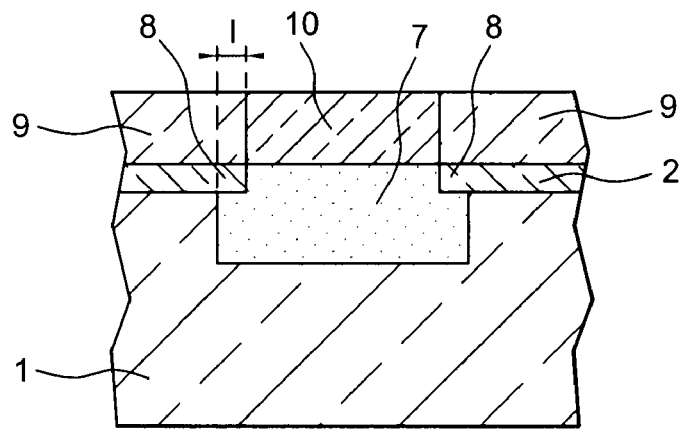
FIG. 2 is an enlarged view of a detail of FIG. 1F, FIGS. 3A and 3B illustrate a variation of embodiment of the present invention.

FIG. 2 is an enlarged view of a detail of FIG. 1F. It more precisely shows the overhangs 8 above the portion made in insulating material 7 housed in the substrate 1. The portion with width 1, above the substrate 1, is monocrystalline (in SiGe or Si).

Of course, intermediate steps can be inserted in the chain of steps just described in order to produce a portion of the MEMS or in the case of technological variations. Thus, it is possible to etch the monocrystalline protection layer before epitaxy in the zones one does not wish to free. This example is illustrated by FIGS. 3A and 3B.

Figure 3A:
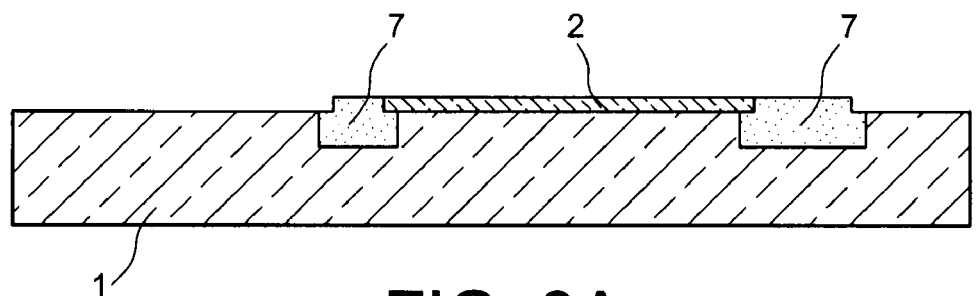

FIG. 3A follows FIG. 1E in this case. The protection layer 2 has been etched locally so as only to allow insulating material 7 to remain between the blocks. Each block 7 then only comprises a single overhang in monocrystalline material.

Figure 3B:
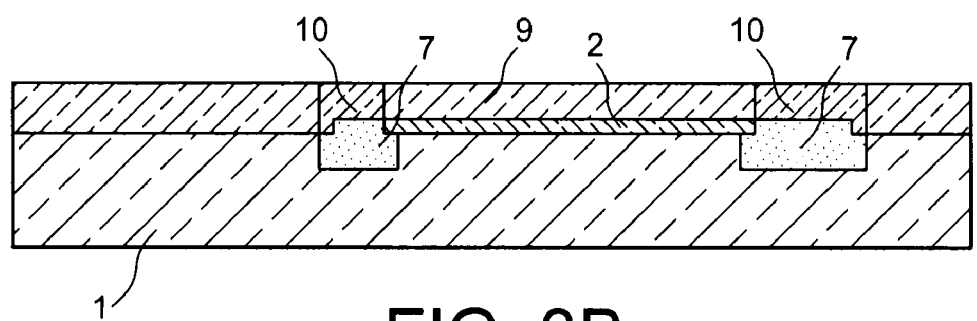

One then proceeds with the silicon epitaxy in order to obtain the structure shown in FIG. 3B. This epitaxied layer comprises a monocrystalline portion 9 at the location where its growth takes place above the protection layer 2 and polycrystalline portions 10 at the locations where its growth takes place above the electrically insulating material 7. On the uncovered portion of the substrate, the monocrystalline material which has developed mixes with the substrate.

It is also possible to produce anchors with different depths or in different materials by proceeding with as many cavity etchings, fillings and etching/CMP steps of the anchors as necessary.

The method is then continued traditionally in order to produce the desired MEMS component. We will now describe three variations of embodiments.

Figure 4A:
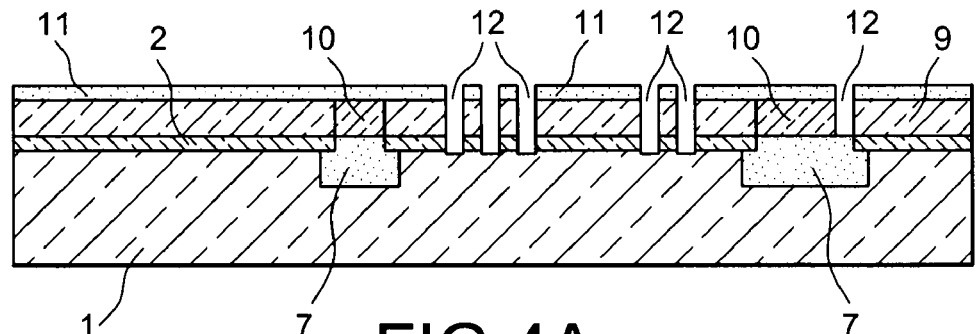
FIGS. 4A to 4E illustrate the last steps of the method according to the present invention, implementing the MON technology.
Figure 4B:
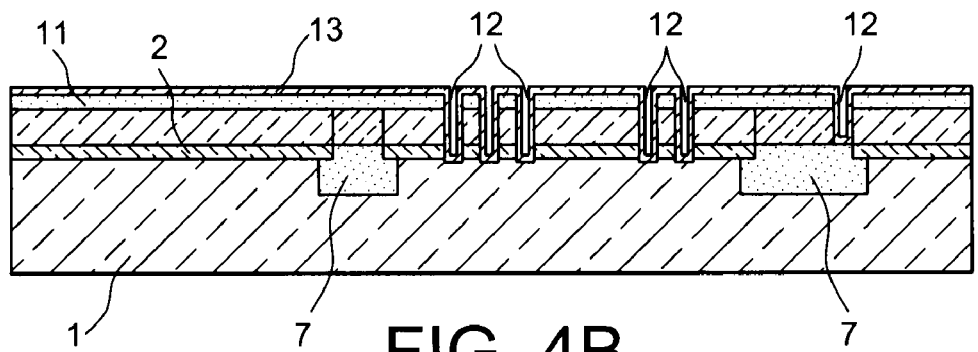
Figure 4C:
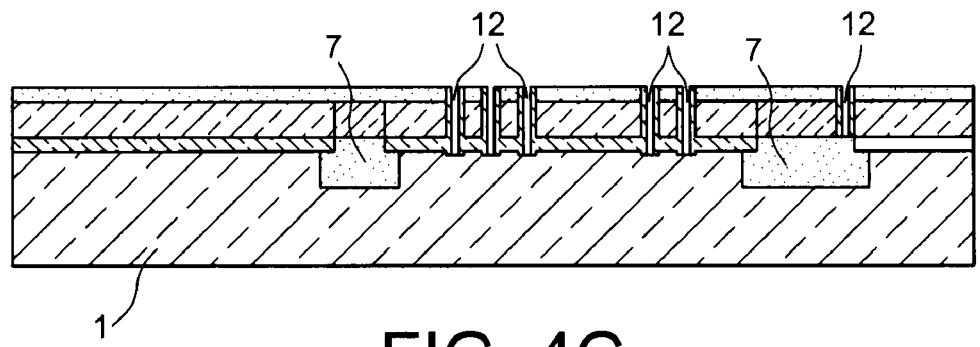
Figure 4D:
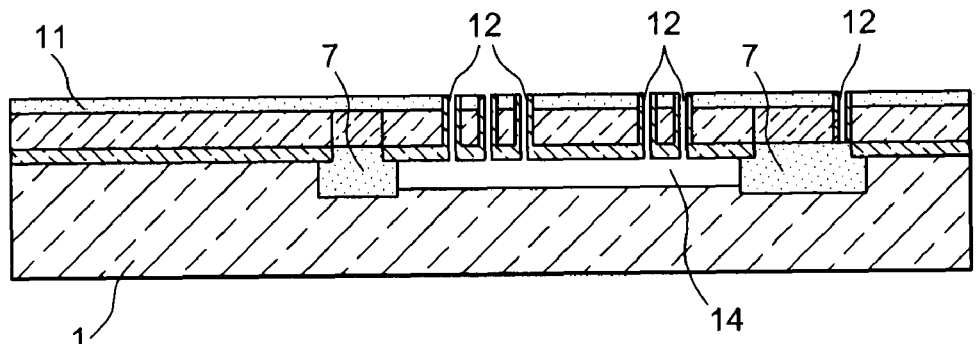
Figure 4E:
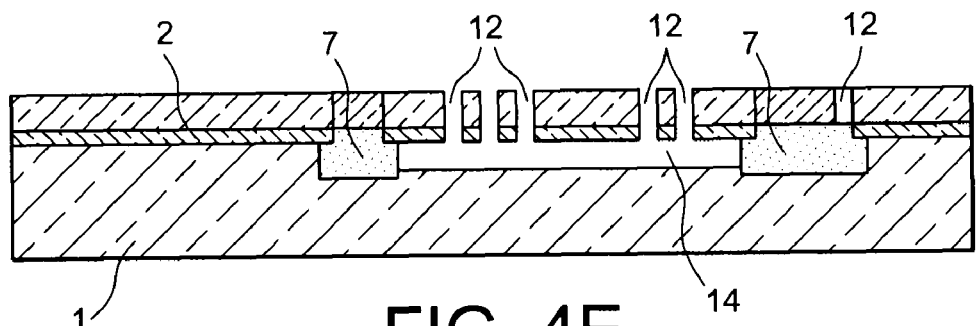

FIGS. 4A and 4E illustrate the last steps of the method according to the present invention implementing the MON (MEMS on Nothing) technology.

FIG. 4A follows FIG. 1F. On the silicon layer comprising portions 9 and 10, we have formed a layer of silicon oxide 11. We then proceed with DRIE lithography etching of the silicon and the SiGe of the structure in order to obtain access paths (channels, holes) 12 up to the source substrate 1.

One then deposits, by epitaxy, a layer of SiGe 13 (see FIG. 4B) with a thickness of 70 nm, for example, and typically comprising 20 to 30% germanium, on the structure previously obtained. The layer 13 is polycrystalline when its growth takes place on the $SiO_2$ layer 11 and on the walls of the access paths 12 etched into polycrystalline material (portions 10) or insulating material (block 7). The growth is monocrystalline, on the walls of the access channels 12, when its growth occurs on the monocrystalline materials of the portions 9, the layer of SiGe 2 and the substrate 1.

One then proceeds with anisotropic etching of the layer of SiGe 13 until the $SiO_2$ layer 11 is exposed (see FIG. 4C). The sides of the access paths 12 remain covered with SiGe while their bottom exposes the monocrystalline silicon of the substrate 1 or the insulating material of the block 7, if applicable.

One then proceeds with isotropic etching of the silicon of the substrate 1, selective in relation to the SiGe, thanks to the access paths 12 in order to free the flexible mechanical element. This etching provides a cavity 14, with a depth between 1 µm and 2 µm, limited by the anchoring zones 7 as shown by FIG. 4D. One can then proceed with etching of the $SiO_2$ layer 11. The layer of SiGe covering the walls of the access paths 12 can potentially also be eliminated by etching (see FIG. 4E). One must take care, during this last etching, not to eliminate the SiGe of the anchoring zone.

Figure 5:
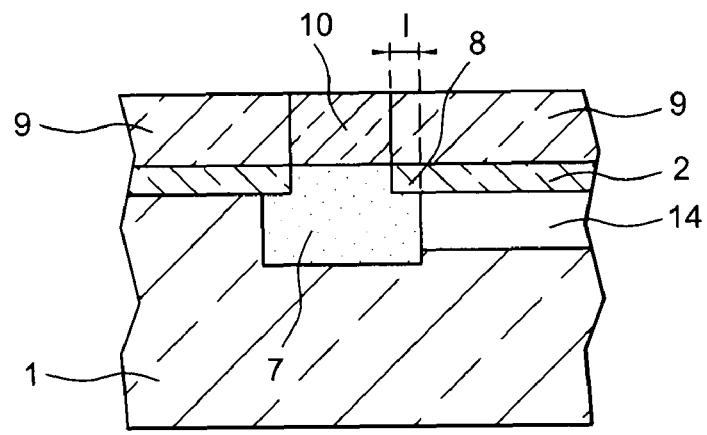
FIG. 5 is an enlarged view of a detail of FIG. 4E, FIGS. 6A and 6B illustrate the last steps of the method according to the present invention, implementing the SON technology.

One of the anchoring zones is shown enlarged in FIG. 5. It more precisely shows an overhang 8 above the portion made in insulating material 7. The portion of width 1 above the block 7 is monocrystalline (in SiGe or Si).

Figure 6A:
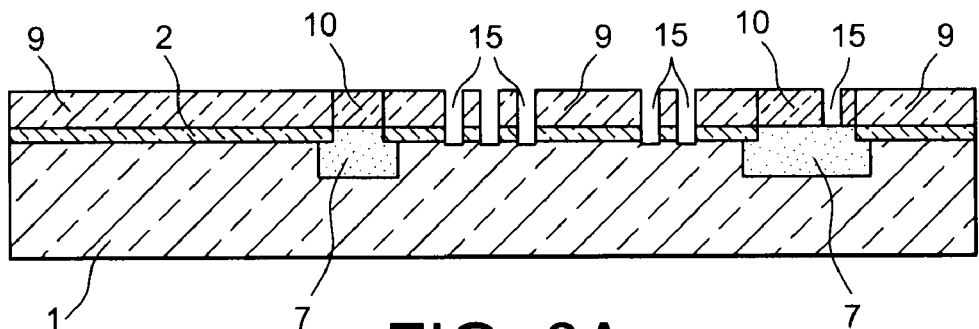
Figure 6B:
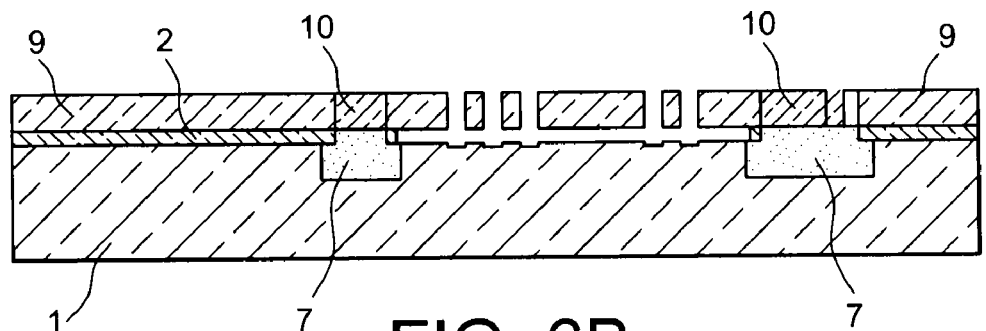

FIGS. 6A and 6B illustrate the last steps of the method according to the present invention implementing the SON technology.

FIG. 6A follows FIG. 1F. One proceeds with lithography and DRIE etching of the superimposed layers 9 (in silicon) and 2 (in SiGe) in order to obtain access paths 15 up to the source substrate 1.

From the access paths 15, one etches the SiGe layer 2 selectively in relation to the silicon surrounding the layer 2. This etching can be a dry etching. It allows the liberation of the flexible mechanical element. This is a partial etching in that the etching has been conducted so that a portion of the layer of SiGe overhanging the blocks 7 remains. This is shown by FIG. 6B.

Figure 7:
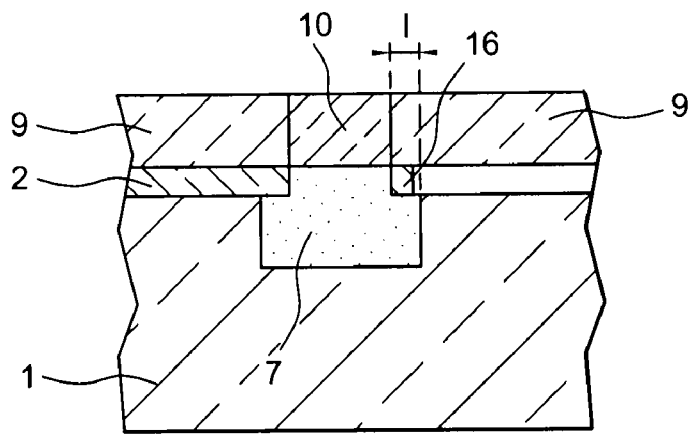
FIG. 7 is an enlarged view of a detail of FIG. 6B, FIGS. 8A and 8B illustrate the last steps of the method according to the present invention, implementing the MON technology and using a stack of epitaxied layers.

One of the anchoring zones is shown enlarged in FIG. 7. It more precisely shows an overhang 16 above the portion (or block) made in insulating material 7. The portion of width 1 above the block 7 is monocrystalline (in SiGe or Si).

In this embodiment, the etching of the SiGe layer 2 is done in time because a portion of this material must remain between the oxide of the insulation blocks 7 and the portion of the silicon layer 9, so that the anchoring is indeed monocrystalline.

Figure 8A:
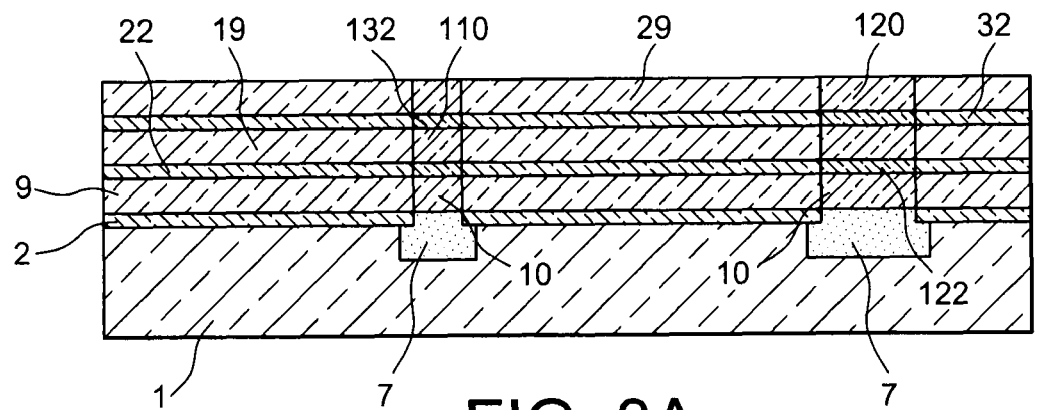
Figure 8B:
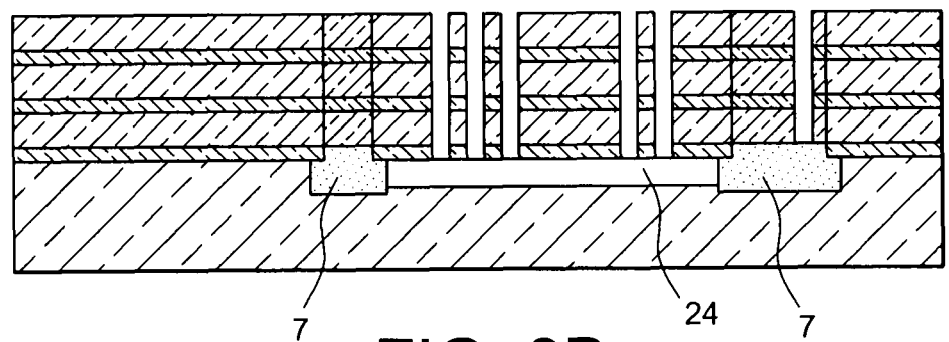

FIGS. 8A and 8B illustrate the last steps of the method according to the present invention implementing the MON technology and using a stack of epitaxied layers.

FIG. 8A follows FIG. 1E. From the structure illustrated by FIG. 1E, one forms, by epitaxy, an alternation of silicon layers and SiGe layers in order to obtain, for example, the structure illustrated by FIG. 8A. This figure shows, on the SiGe layer 2 allowing the SiO$_2$ blocks 7 to show on the surface, the following succession of layers:

a layer of silicon comprising monocrystalline portions 9 (epitaxied on the monocrystalline SiGe of the layer 2) and polycrystalline portions 10 (epitaxied on the SiO$_2$ of the blocks 7), as in FIG. 1F;

a layer of SiGe comprising monocrystalline portions 22 (epitaxied on the polycrystalline silicon portions 9) and on polycrystalline portions 122 (epitaxied on the polycrystalline silicon portions 10);

a layer of silicon comprising monocrystalline portions 19 (epitaxied on the monocrystalline SiGe portions 22) and polycrystalline portions 110 (epitaxied on the polycrystalline SiGe portions 122);

a layer of SiGe comprising monocrystalline portions 32 (epitaxied on the monocrystalline silicon portions 19) and polycrystalline portions 132 (epitaxied on the polycrystalline silicon portions 110);

a layer of silicon comprising monocrystalline portions 29 (epitaxied on the monocrystalline SiGe portions 32) and polycrystalline portions 120 (epitaxied on the polycrystalline SiGe portions 132).

The continuation of the steps is similar to the steps illustrated by FIGS. 4A and 4E. FIG. 8B shows the final structure obtained, with the cavity 24 limited by the anchor zones 7 and a monocrystalline anchor made up of an overhang of stacked monocrystalline layers made in SiGe or Si.

The advantages which follow, among others, are procured by the invention. The technological stack rests on traditional technological steps of microelectronics and uses a standard substrate. The method according to the invention is CMOS compatible and is completely applicable to the SON and MON technologies. The anchors are electrically insulated if the anchoring cavities are filled with a dielectric material. The embedment of the flexible mechanical element is monocrystalline. This results in fewer mechanical losses (leading to a better quality factor of the components) and better shock resistance. The anchors (insulating or not) are made in silicon and can serve as an etching boundary during the step for freeing the flexible mechanical element. This results in better control of the liberation step (no risk of overetching, for example) and access to varied patterns. The shape of the freed elements is not limited by the isotropic nature of the freeing etching. It is then possible to produce square or hexagonal suspended membranes, not only round ones.

The method according to the invention can be used for all MEMS and NEMS applications. It implements a technology adapted to low-cost and high-volume markets: mobile telephones, automobiles, games, For example:
for automobiles: accelerometers, rate gyros, pressure sensors, MEMS or NEMS mechanical resonator-based chemical sensors,
for mobile telephones: time bases (RF resonators), MEMS or NEMS mechanical filters, accelerometers, microphones,
for games: accelerometers, rate gyros.

The invention claimed is:

1. A method for producing a MEMS/NEMS structure from a substrate comprising at least one portion made in a monocrystalline semiconductor material, the structure comprising a flexible mechanical element connected to said portion of the substrate by at least one anchoring zone, the method comprising the following steps:

forming a first protection layer in the monocrystalline semiconductor material on a free face of said portion of the substrate, the first protection layer being made in a different material from that of said substrate portion made in the monocrystalline semiconductor material, etching of the first protection layer and the substrate in order to produce at least one cavity, the etching being conducted so as to leave an overhang in the material of the protection layer on edges of the cavity, filling of the cavity by an electrically insulating material at least up to a free face of the first protection layer in order to obtain an insulating anchoring portion, forming, by epitaxy of a semiconductor material from the first protection layer and the electrically insulating material, an epitaxied layer designed for a production of the flexible mechanical element, the epitaxied layer being monocrystalline on the first protection layer and polycrystalline on the electrically insulating material, releasing the flexible mechanical element by etching, through a mask, from at least the first protection layer, the etching allowing at least one portion of said overhang to remain.

2. The method according to claim 1, wherein the etching of the first protection layer and the substrate is done:
by etching of at least the first protection layer, and
by isotropically etching the substrate, this isotropic etching being selective in relation to the first protection layer.

3. The method according to claim 1, also including the following steps:
forming of a stopping layer from a planarization operation, on the first protection layer, before the etching of the first protection layer,
etching of the stopping layer in order to produce the cavity, wherein the filling of the cavity includes making the electrically insulating material extend beyond the free face of the first protection layer, and planarizing until the free face of the first protection layer is exposed.

4. The method according to claim 3, wherein the planarizing comprises chemical-mechanical polishing with stopping on the stopping layer, followed by etching of the stopping layer and the electrically insulating material filling in the cavity until the free face of the first protection layer is exposed.

5. The method according to any one of claims 1 to 4 wherein the releasing includes, on the epitaxied layer from the first protection layer and the electrically insulating material:

forming a second protection layer, etching, successively, of the second protection layer, the epitaxied layer and, eventually, the first protection layer in order to define the flexible mechanical element, and forming a third protection layer on an assembly obtained in the etching of the second protection layer, the epitaxied layer, and the first protection layer.

6. The method according to claim 5, wherein the second protection layer and the third protection layer are formed by deposition or epitaxy.

7. The method according to claim 5, wherein the releasing the flexible mechanical element also includes forming a cavity in the substrate.

8. The method according to claim 5, wherein the releasing the flexible mechanical element includes etching a portion of the third protection layer and eventually a portion of the first protection layer formed on the face of the substrate.

9. The method according to any one of claims 1 to 4, wherein said portion of the substrate is made in silicon.

10. The method according to any one of claims 1 to 4, wherein the first protection layer is made in SiGe.

11. The method according to any one of claims 1 to 4, wherein the electrically insulating material is chosen among $SiO_2$ and $Si_3N_4$.

12. The method according to any one of claims 1 to 4, wherein the epitaxied semiconductor material from the first protection layer is in silicon.

* * * * *